United States Patent
Tsen et al.

(10) Patent No.: US 8,134,390 B2
(45) Date of Patent: Mar. 13, 2012

(54) SIGNAL CONVERTER AND METHOD THEREOF

(75) Inventors: Ting-Chin Tsen, Taipei (TW); Shu-Chia Lin, Taipei (TW); Wen-Yueh Hsieh, Taipei (TW)

(73) Assignee: INNO-TECH Co., Ltd., Taipei (TW)

( * ) Notice: Subject to any disclaimer, the term of this patent is extended or adjusted under 35 U.S.C. 154(b) by 8 days.

(21) Appl. No.: 12/651,440

(22) Filed: Dec. 31, 2009

(65) Prior Publication Data

US 2010/0176863 A1    Jul. 15, 2010

(30) Foreign Application Priority Data

Jan. 14, 2009   (TW) ................................ 98101277 A

(51) Int. Cl.
*H03K 4/02*   (2006.01)
(52) U.S. Cl. ........................ 327/127; 327/131
(58) Field of Classification Search .................. 363/127
See application file for complete search history.

(56) References Cited

U.S. PATENT DOCUMENTS 3,408,588 A * 10/1968 Rugo ............................ 330/280
5,397,947 A *  3/1995 Craft ............................ 327/104

\* cited by examiner

*Primary Examiner* — Lincoln Donovan
*Assistant Examiner* — Daniel Rojas

(57) ABSTRACT

An integrated circuit (IC) type voltage signal converter is provided for integrating with other ICs. The signal converter includes a first chopper circuit module, a second chopper circuit module, a full wave combining module, and a zero point detecting circuit module. Each of the circuit modules may be formed by an IC module. The first and second chopper circuit modules are composed of differential operational amplifiers for converting a high voltage signal into first and second low voltage half wave signals. The full wave combining module combines the first and second low voltage half wave signals to obtain a full wave signal. The zero point detecting circuit module converts the first and second low voltage half wave signals into a square wave having the same frequency of the high voltage signal.

18 Claims, 4 Drawing Sheets

SIGNAL CONVERTER AND METHOD THEREOF

BACKGROUND OF THE INVENTION

1. Field of the Invention

The present invention generally relates to a signal converting apparatus, and more particularly, to a signal converter and a method thereof, which are adapted for a voltage signal converting application. The signal converter of the present invention is an integrated circuit (IC) type signal converter, adapted for converting a high voltage sine wave signal into a low voltage full wave and/or half wave signal, thus improving the stability of the circuit.

2. The Prior Arts

Typically, a non-IC type conventional signal converting circuit is often used for converting a high voltage (e.g., 110V or 220V commercial power) into a low voltage (e.g., in a range from 0 to 10V).

However, such a non-IC type conventional high voltage to low voltage converting circuit often has a low stability, and is often disadvantageously affected by environmental factors (e.g., operation temperature). Further, being a non-IC type circuit, the conventional signal converting circuit cannot be integrated with other ICs, and is thus not adapted for systematic integration. As such, the application of such non-IC type conventional signal converting circuits is restricted.

Accordingly, a high voltage to low voltage converting circuit is desired to be configured in an IC type for converting a high voltage (e.g., 110V or 220V commercial power) into a low voltage (e.g., in a range from 0 to 10V). The IC type signal converting circuit is further desired to be advantageously more stable, and not likely to be affected by environmental factors, and can be integrated with other ICs, thus being adapted for systematic integration.

SUMMARY OF THE INVENTION

A primary objective of the present invention is to provide a signal converter and a method thereof, adapted for a voltage signal converting application. The signal converter of the present invention is configured in an IC type, and is adapted for converting a high voltage sine wave signal into a low voltage full wave and/or half wave signal, and improving the stability of the circuit.

Another objective of the present invention is to provide a signal converter and a method thereof, adapted for a voltage signal converting application. The signal converter of the present invention is configured in an IC type, and is adapted for integration with other ICs, thus improving the systematic integration.

A further objective of the present invention is to provide a signal converter and a method thereof, adapted for a voltage signal converting application. The signal converter of the present invention is adapted for being integrated in a micro controller unit (MCU).

For achieving the foregoing objectives and others, the present invention provides an IC type signal converter, which is capable of being integrated with other ICs. For example, the signal converter can be integrated in an MCU, thus achieving an improved systematic integration. The signal converter includes a first chopper circuit module, a second chopper circuit module, a full wave combining module, and a zero point detecting circuit module. The first chopper circuit module, and/or the second chopper circuit module, and/or the full wave combining module, and/or the zero point detecting circuit module, are IC modules.

The first chopper circuit module and the second chopper circuit module are composed of differential operational amplifiers. A high voltage signal is inputted to differential input terminals of the first chopper circuit module, and differential input terminals of the second chopper circuit module. The high voltage signal can be any types of high voltage signals, and is not restricted to be a certain type. The high voltage signal is exemplified hereby as an attenuated commercial power signal (110V or 220V). The first chopper circuit module converts the high voltage signal inputted thereto into a first low voltage half wave signal, and transmits the first low voltage half wave signal to the full wave combining module and/or the zero point detecting circuit module. The second chopper circuit module converts the high voltage signal inputted thereto into a second low voltage half wave signal, and transmits the second low voltage half wave signal to the full wave combining module and/or the zero point detecting circuit module.

The full wave combining module receives the first low voltage half wave signal and the second low voltage half wave signal, and then combines the first low voltage half wave signal and the second low voltage half wave signal to obtain a full wave signal for outputting.

The zero point detecting circuit module receives the first low voltage half wave signal and the second low voltage half wave signal, and then converts the first low voltage half wave signal and the second low voltage half wave signal into a square wave having a same frequency of the high voltage signal (i.e., the commercial power). The square wave has a high level corresponding to a positive half cycle of the high voltage signal, and a low level corresponding to a negative half cycle of the high voltage signal. The square wave has a rise edge and a fall edge which occur at the zero point, i.e., the time when the voltage of the high voltage signal is zero.

The present invention further provides a method adapted for the signal converter. First, a high voltage signal is inputted into differential input terminals of a first chopper circuit module, differential input terminals of a second chopper circuit module. The high voltage signal can be any types of high voltage signals, and is not restricted to be a certain type. The high voltage signal is exemplified hereby as an attenuated commercial power signal (110V or 220V). The first chopper circuit module converts the high voltage signal inputted thereto into a first low voltage half wave signal, and transmits the first low voltage half wave signal to the full wave combining module and/or the zero point detecting circuit module. The second chopper circuit module converts the high voltage signal inputted thereto into a second low voltage half wave signal, and transmits the second low voltage half wave signal to the full wave combining module and/or the zero point detecting circuit module.

Then, the full wave combining module receives the first low voltage half wave signal and the second low voltage half wave signal, and then combines the first low voltage half wave signal and the second low voltage half wave signal to obtain a full wave signal for outputting.

The zero point detecting circuit module receives the first low voltage half wave signal and the second low voltage half wave signal, and then converts the first low voltage half wave signal and the second low voltage half wave signal into a square wave having a same frequency of the high voltage signal (i.e., the commercial power). The square wave has a high level corresponding to a positive half cycle of the high voltage signal, and a low level corresponding to a negative half cycle of the high voltage signal. The square wave has a rise edge and a fall edge which occur at the zero point, i.e., the time when the voltage of the high voltage signal is zero.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
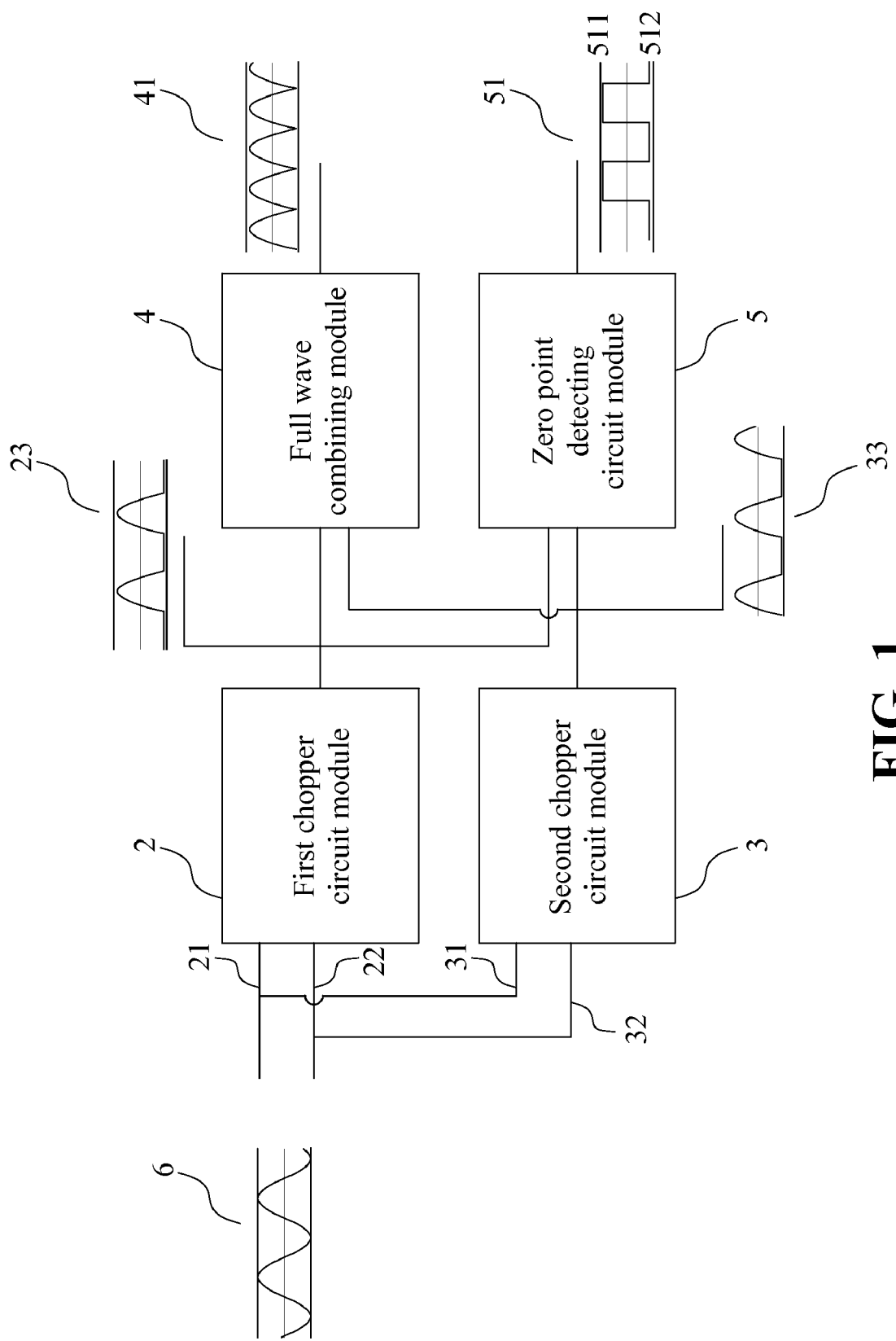
FIG. 1 is a schematic view of a signal converter for illustrating the structure and operation of the signal converter according to an embodiment of the present invention.

FIG. 1 is a schematic view of a signal converter for illustrating the structure and operation of the signal converter according to an embodiment of the present invention. As shown in FIG. 1, the present invention provides a signal converter 1. The signal converter 1 is configured in an integrated circuit (IC) type. The IC type signal converter 1 can be integrated with other ICs. For example, the signal converter can be integrated into a micro controller unit (MCU) for improving the systematic integration. Referring to FIG. 1, the signal converter includes a first chopper circuit module 2, a second chopper circuit module 3, a full wave combining module 4, and a zero point detecting circuit module 5. The first chopper circuit module 2, and/or the second chopper circuit module 3, and/or the full wave combining module 4, and/or the zero point detecting circuit module 5, are IC modules.

The first chopper circuit module 2 and the second chopper circuit module 3 are composed of differential operational amplifiers. A high voltage signal 6 is inputted to differential input terminals 21 and 22 of the first chopper circuit module 2, and differential input terminals 31 and 32 of the second chopper circuit module 3. The high voltage signal 6 can be any types of high voltage signals, and is not restricted to be a certain type. The high voltage signal 6 is exemplified hereby as an attenuated commercial power signal (110V or 220V). The first chopper circuit module 2 converts the high voltage signal 6 inputted thereto into a first low voltage half wave signal 23, and transmits the first low voltage half wave signal 23 to the full wave combining module 4 and/or the zero point detecting circuit module 5. The second chopper circuit module 3 converts the high voltage signal 6 inputted thereto into a second low voltage half wave signal 33, and transmits the second low voltage half wave signal 33 to the full wave combining module 4 and/or the zero point detecting circuit module 5.

The full wave combining module 4 receives the first low voltage half wave signal 23 and the second low voltage half wave signal 33, and then combines the first low voltage half wave signal 23 and the second low voltage half wave signal 33 to obtain a full wave signal 41 for outputting.

The zero point detecting circuit module 5 receives the first low voltage half wave signal 23 and the second low voltage half wave signal 33, and then converts the first low voltage half wave signal 23 and the second low voltage half wave signal 33 into a square wave 51 having a same frequency of the high voltage signal (i.e., the commercial power). The square wave 51 has a high level 511 corresponding to a positive half cycle of the high voltage signal, and a low level 512 corresponding to a negative half cycle of the high voltage signal. The square wave has a rise edge and a fall edge which occur at the zero point, i.e., the time when the voltage of the high voltage signal is zero.

Figure 2:
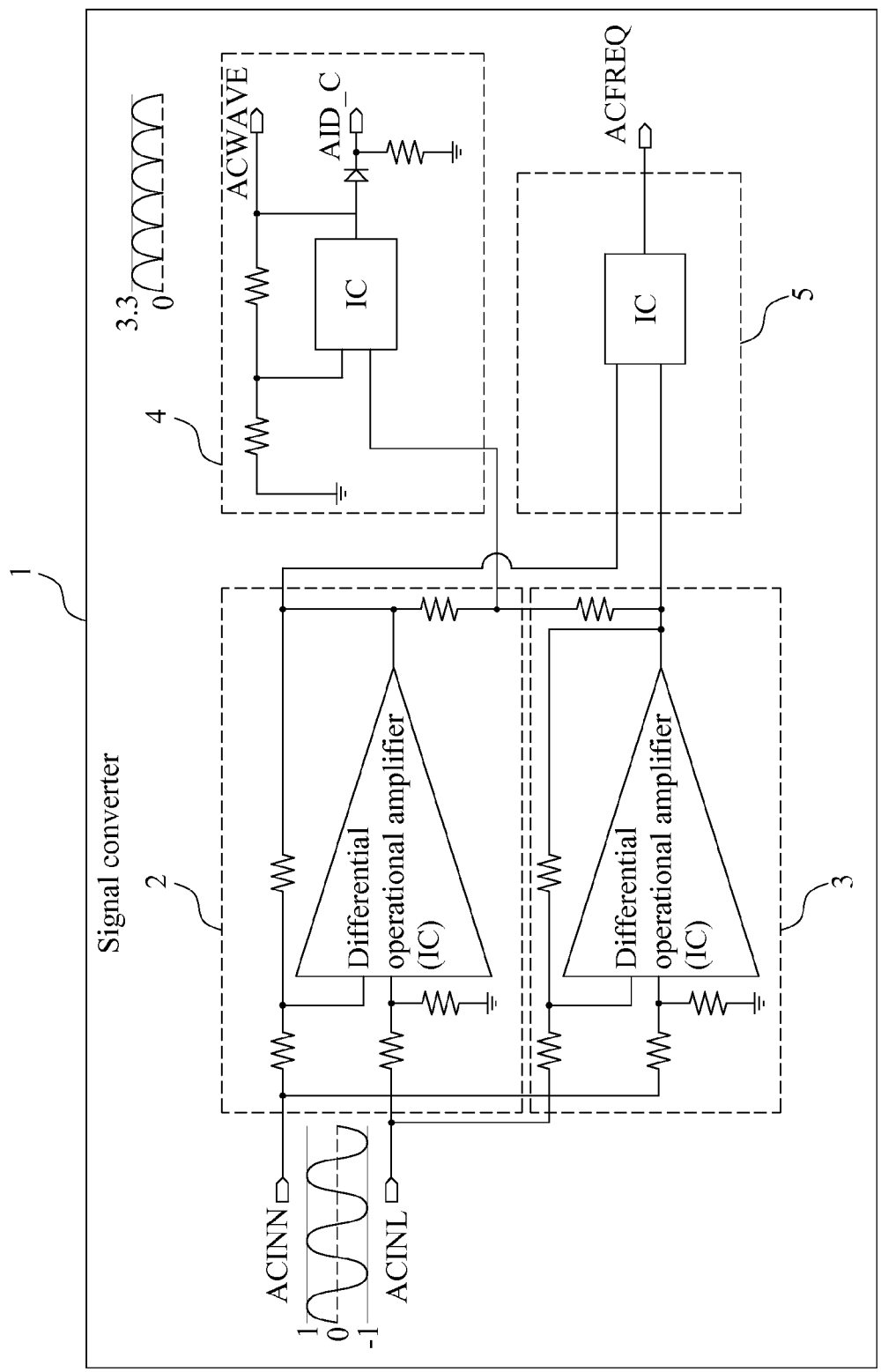
FIG. 2 is a schematic view of a signal converter for illustrating the structure and operation of the signal converter according to an embodiment of the present invention.

FIG. 2 is a schematic view of a signal converter for illustrating the structure and operation of the signal converter 1 according to an embodiment of the present invention. Referring to FIG. 2, the signal converter 1 is an IC type signal converter including a first chopper circuit module 2, a second chopper circuit module 3, a full wave combining module 4, and a zero point detecting circuit module 5. The first chopper circuit module 2, the second chopper circuit module 3, the full wave combining module 4, and the zero point detecting circuit module 5 are all IC type circuits.

Figure 3:
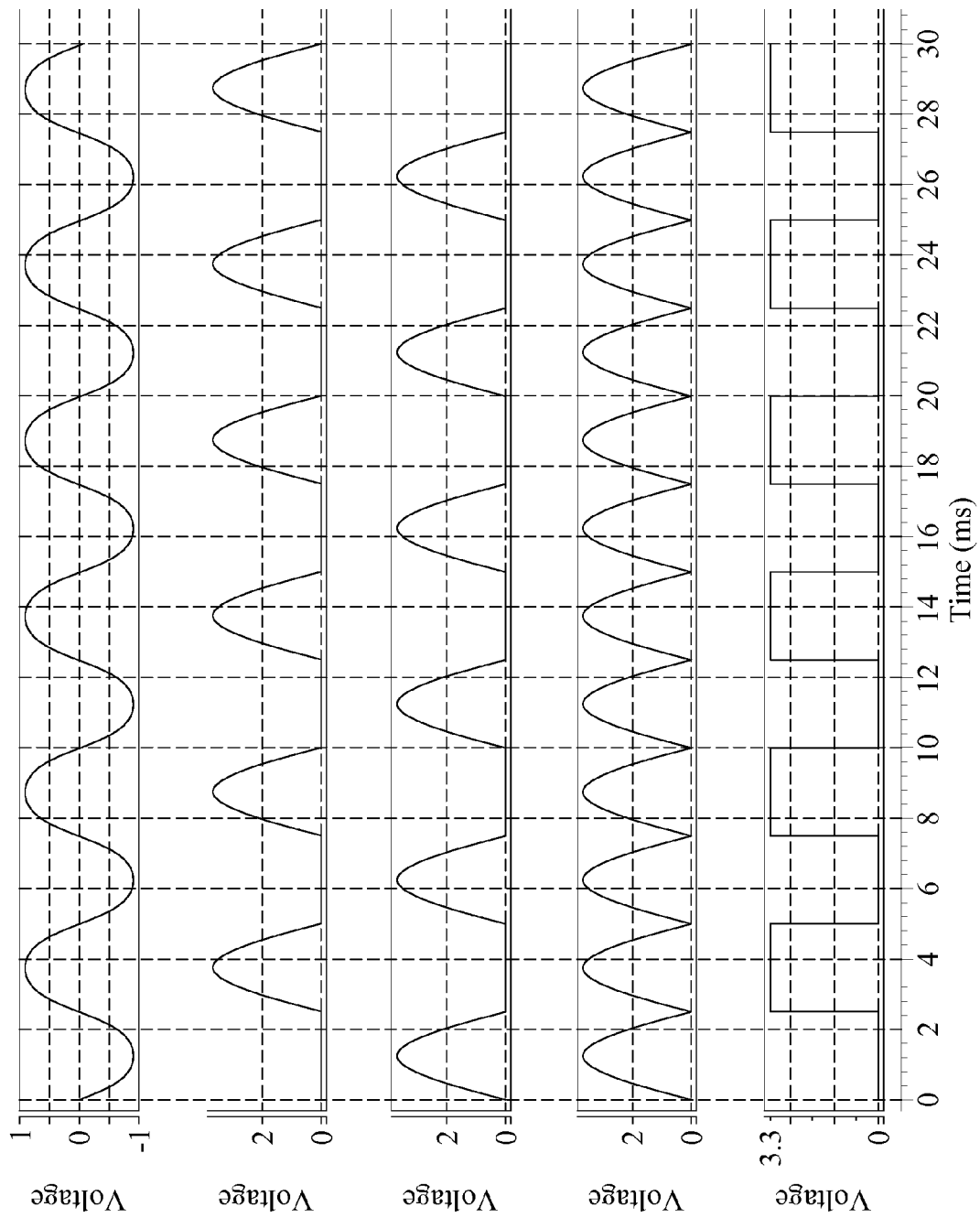
FIG. 3a is a schematic diagram for illustrating the attenuated commercial power signal (110V or 220V) shown in FIG. 2.
FIG. 3b is a schematic diagram for illustrating the first low voltage half wave signal shown in FIG. 2.
FIG. 3c is a schematic diagram for illustrating the second low voltage half wave signal shown in FIG. 2.
FIG. 3d is a schematic diagram for illustrating the full wave signal as shown in FIG. 2.
FIG. 3e is a schematic diagram for illustrating the square wave as shown in FIG. 2.

The first chopper circuit module 2 and the second chopper circuit module 3 are composed of differential operational amplifiers. An attenuated commercial power signal 7 (110V or 220V) as shown in FIG. 3a is inputted to the differential input terminals 21 and 22 of the first chopper circuit module 2, and the differential input terminals 31 and 32 of the second chopper circuit module 3. The first chopper circuit module 2 converts the attenuated commercial power signal 7 inputted thereto into a first low voltage half wave signal 23 as shown in FIG. 3b, and transmits the first low voltage half wave signal 23 to the full wave combining module 4 and/or the zero point detecting circuit module 5. The second chopper circuit module 3 converts the attenuated commercial power signal 7 inputted thereto into a second low voltage half wave signal 33 as shown in FIG. 3c, and transmits the second low voltage half wave signal 33 to the full wave combining module 4 and/or the zero point detecting circuit module 5.

The full wave combining module 4 receives the first low voltage half wave signal 23 and the second low voltage half wave signal 33, and then combines the first low voltage half wave signal 23 and the second low voltage half wave signal 33 to obtain a full wave signal 41 as shown in FIG. 3d for outputting.

The zero point detecting circuit module 5 receives the first low voltage half wave signal 23 and the second low voltage half wave signal 33, and then converts the first low voltage half wave signal 23 and the second low voltage half wave signal 33 into a square wave 51 as shown in FIG. 3e having a same frequency of the attenuated commercial power signal 7 (110V or 220V). As shown in FIG. 3e, the square wave 51 has a high level 511 corresponding to a positive half cycle of the commercial power signal 7, and a low level 512 corresponding to a negative half cycle of the commercial power signal 7. The square wave has a rise edge and a fall edge which occur at the zero point, i.e., the time when the voltage of the commercial power signal 7 is zero.

FIG. 3a is a schematic diagram for illustrating the attenuated commercial power signal 7 (110V or 220V) shown in FIG. 2. FIG. 3b is a schematic diagram for illustrating the first low voltage half wave signal 23 shown in FIG. 2. FIG. 3c is a schematic diagram for illustrating the second low voltage half wave signal 33 shown in FIG. 2. FIG. 3d is a schematic diagram for illustrating the full wave signal 41 as shown in FIG. 2. FIG. 3e is a schematic diagram for illustrating the square wave 51 as shown in FIG. 2.

Figure 4:
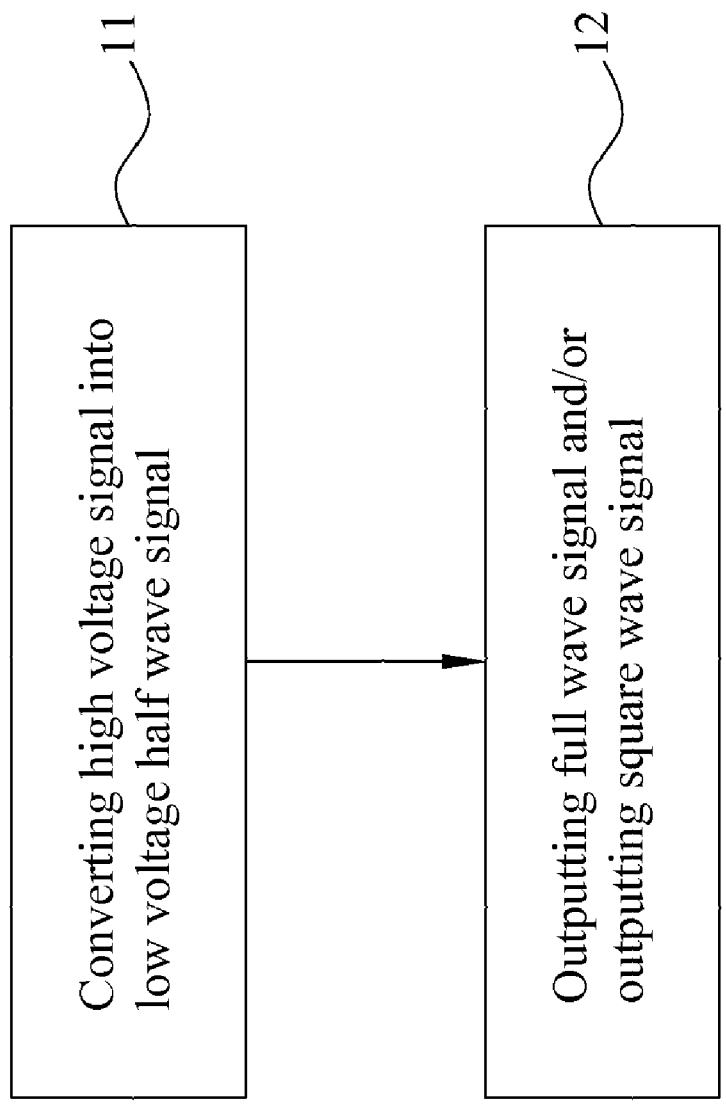
FIG. 4 is a flow chart for illustrating the method of the signal converter according to an embodiment of the present invention.

FIG. 4 is a flow chart for illustrating the method of the signal converter according to an embodiment of the present invention. Referring to FIG. 4, firstly, at step 11, a high voltage signal 6 is inputted to differential input terminals 21 and 22 of the first chopper circuit module 2, and differential input terminals 31 and 32 of the second chopper circuit module 3. The high voltage signal 6 can be any types of high voltage signals, and is not restricted to be a certain type. The high voltage signal 6 is exemplified hereby as an attenuated commercial power signal (110V or 220V). The first chopper circuit module 2 converts the high voltage signal 6 inputted thereto into a first low voltage half wave signal 23, and transmits the first low voltage half wave signal 23 to the full wave combining module 4 and/or the zero point detecting circuit module 5. The second chopper circuit module 3 converts the high voltage signal 6 inputted thereto into a second low voltage half wave signal 33, and transmits the second low voltage half wave signal 33 to the full wave combining module 4 and/or the zero point detecting circuit module 5. Then, the flow goes to step 12.

At step 12, the full wave combining module 4 receives the first low voltage half wave signal 23 and the second low voltage half wave signal 33, and then combines the first low voltage half wave signal 23 and the second low voltage half wave signal 33 to obtain a full wave signal 41 for outputting; and/or the zero point detecting circuit module 5 receives the first low voltage half wave signal 23 and the second low voltage half wave signal 33, and then converts the first low voltage half wave signal 23 and the second low voltage half wave signal 33 into a square wave 51 having a same frequency of the high voltage signal (i.e., the commercial power) for outputting. The square wave 51 has a high level 511 corresponding to a positive half cycle of the high voltage signal, and a low level 512 corresponding to a negative half cycle of the high voltage signal. The square wave has a rise edge and a fall edge which occur at the zero point, i.e., the time when the voltage of the high voltage signal is zero.

Although the high voltage signal 6 is exemplified in the foregoing embodiments with an attenuated commercial power (110V or 220V) signal, the high voltage signal 6 can be any types of high voltage signals, and is not restricted to be a certain type. The situation of employing other types of high voltage signals is similar with and can be learnt by referring to the above discussion with respect to the attenuated commercial power signal, and is not to be iterated hereby.

In summary, the present invention provides a signal converter and a method thereof, which are adapted for a voltage signal converting application. The signal converter of the present invention is an integrated circuit (IC) type signal converter, adapted for converting a high voltage sine wave signal into a low voltage full wave and/or half wave signal, thus improving the stability of the circuit. The IC type signal converter of the present invention can be integrated with other ICs for improving the systematic integration. Briefly, the signal converter and the method thereof of the present invention have the following advantages:

1. The signal converter is configured with an IC type, and is adapted for converting a high voltage sine wave signal into a low voltage full wave and/or half wave signal, and improving a circuit stability thereof; and
2. The signal converter is configured with an IC type, and thus can be integrated with other ICs, so that the signal converter can be integrated into an MCU, thus improving the systematic integration.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A signal converter, adapted for a voltage signal converting application, the signal converter comprising:
   a first chopper circuit module, composed of a differential operational amplifier, and having a differential input terminal, the differential input terminal of the first chopper circuit module receiving a high voltage signal and converting the high voltage signal into a first low voltage half wave signal for outputting;
   a second chopper circuit module, composed of another differential operational amplifier, and having a differential input terminal, the differential input terminal of the second chopper circuit module receiving the high voltage signal and converting the high voltage signal into a second low voltage half wave signal for outputting;
   a full wave combining module, receiving the first low voltage half wave signal from the first chopper circuit module and the second low voltage half wave signal from the second chopper circuit module, and combining the first low voltage half wave signal and the second low voltage half wave signal into a full wave signal for outputting; and
   a zero point detecting circuit module, receiving the first low voltage half wave signal from the first chopper circuit module and the second low voltage half wave signal from the second chopper circuit module, and converting the first low voltage half wave signal and the second low voltage half wave signal into a square wave having a same frequency of the high voltage signal for outputting;
   wherein the square wave has a high level corresponding to a positive half cycle of the high voltage signal and a low level corresponding to a negative cycle of the high voltage signal, and the square wave has a rise edge and a fall edge which occur at a time when a voltage of the high voltage signal is zero.

2. The signal converter according to claim 1, wherein the signal converter is configured in an integrated circuit (IC) type.

3. The signal converter according to claim 1, wherein the first chopper circuit module is configured in an integrated circuit (IC) type.

4. The signal converter according to claim 1, wherein the second chopper circuit module is configured in an integrated circuit (IC) type.

5. The signal converter according to claim 1, wherein the full wave combining module is configured in an integrated circuit (IC) type.

6. The signal converter according to claim 1, wherein the zero point detecting circuit module is configured in an integrated circuit (IC) type.

7. The signal converter according to claim 2 being integrated in a micro controller unit (MCU).

8. A signal converter, adapted for a voltage signal converting application, the signal converter comprising:

a first chopper circuit module, composed of a differential operational amplifier, and having a differential input terminal, the differential input terminal of the first chopper circuit module receiving a high voltage signal and converting the high voltage signal into a first low voltage half wave signal for outputting;

a second chopper circuit module, composed of another differential operational amplifier, and having a differential input terminal, the differential input terminal of the second chopper circuit module receiving the high voltage signal and converting the high voltage signal into a second low voltage half wave signal for outputting; and a zero point detecting circuit module, receiving the first low voltage half wave signal from the first chopper circuit module and the second low voltage half wave signal from the second chopper circuit module, and converting the first low voltage half wave signal and the second low voltage half wave signal into a square wave having a same frequency of the high voltage signal for outputting;

wherein the square wave has a high level corresponding to a positive half cycle of the high voltage signal and a low level corresponding to a negative cycle of the high voltage signal, and the square wave has a rise edge and a fall edge which occur at a time when a voltage of the high voltage signal is zero.

9. A method adapted for a signal converter, applied for a voltage signal converting application, the method comprising the steps of:

inputting a high voltage signal to a differential input terminal of a first chopper circuit module and a differential input terminal of a second chopper circuit module, respectively;

using the first chopper circuit module to convert the high voltage signal inputted thereto into a first low voltage half wave signal for outputting;

using the second chopper circuit module to convert the high voltage signal inputted thereto into a second low voltage half wave signal for outputting; and using a zero point detecting circuit module to receive the first low voltage half wave signal and the second low voltage half wave signal, and convert the first low voltage half wave signal and the second low voltage half wave signal into a square wave having a same frequency of the high voltage signal for outputting;

wherein the square wave has a high level corresponding to a positive half cycle of the high voltage signal and a low level corresponding to a negative cycle of the high voltage signal, and the square wave has a rise edge and a fall edge which occur at a time when a voltage of the high voltage signal is zero.

10. The method according to claim 9, further comprising the step of using a full wave combining module to receive the first low voltage half wave signal and the second low voltage half wave signal, and combine the first low voltage half wave signal and the second low voltage half wave signal into a full wave signal for outputting.

11. The method according to claim 9, wherein the signal converter is configured in an integrated circuit (IC) type.

12. The method according to claim 9, wherein the first chopper circuit module is configured in an integrated circuit (IC) type.

13. The method according to claim 9, wherein the second chopper circuit module is configured in an integrated circuit (IC) type.

14. The method according to claim 9, wherein the full wave combining module is configured in an integrated circuit (IC) type.

15. The method according to claim 9, wherein the zero point detecting circuit module is configured in an integrated circuit (IC) type.

16. The method according to claim 11, wherein the signal converter integrated in a micro controller unit (MCU).

17. The method according to claim 12, wherein the first chopper circuit module is composed of a differential operational amplifier.

18. The method according to claim 13, wherein the second chopper circuit module is composed of a differential operational amplifier.

* * * * *